United States Patent
Imanishi

(10) Patent No.: US 12,431,887 B2
(45) Date of Patent: Sep. 30, 2025

(54) SWITCHING ELEMENT DRIVE CIRCUIT

(71) Applicant: Mitsubishi Electric Corporation, Tokyo (JP)

(72) Inventor: Motoki Imanishi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 55 days.

(21) Appl. No.: 18/447,842

(22) Filed: Aug. 10, 2023

(65) Prior Publication Data
US 2024/0146294 A1     May 2, 2024

(30) Foreign Application Priority Data
Oct. 27, 2022 (JP) ................. 2022-172029

(51) Int. Cl.
*H03K 17/0812*     (2006.01)
(52) U.S. Cl.
CPC . *H03K 17/08122* (2013.01); *H03K 17/08128* (2013.01)
(58) Field of Classification Search
CPC ............... H03K 17/08122; H03K 17/08128
See application file for complete search history.

(56) References Cited

U.S. PATENT DOCUMENTS

| | | | |
|---|---|---|---|
| 7,091,588 B2 * | 8/2006 | Akiyama | H01L 23/48 257/532 |
| 2004/0232971 A1 | 11/2004 | Kawasaki et al. | |
| 2015/0085403 A1 | 3/2015 | Santos et al. | |
| 2018/0097515 A1 * | 4/2018 | Norling | H03K 17/0828 |
| 2021/0184668 A1 * | 6/2021 | Habu | H03K 17/687 |

FOREIGN PATENT DOCUMENTS

| | | | |
|---|---|---|---|
| CN | 114079444 A * | 2/2022 | ...... H03K 17/08122 |
| JP | 2004-274262 A | 9/2004 | |
| JP | 2010-239114 A | 10/2010 | |
| JP | 5487922 B2 * | 5/2014 | |

OTHER PUBLICATIONS

"Notice of Reasons for Refusal" Office Action issued in JP 2022-172029; mailed by the Japanese Patent Office on Aug. 26, 2025.

* cited by examiner

*Primary Examiner* — Lincoln D Donovan
*Assistant Examiner* — James G Yeaman
(74) *Attorney, Agent, or Firm* — Studebaker Brackett PLLC

(57) ABSTRACT

An object is to provide a technique that eliminates the need for an external circuit for enhancing the breakdown voltage. A switching element drive circuit includes a primary circuit and a secondary circuit, and an insulating element isolating the primary circuit and the secondary circuit from each other in terms of a direct current. The secondary circuit includes a semiconductor substrate, a detector provided on a portion of the semiconductor substrate, including a pn junction isolation portion, and configured to detect a voltage of a high voltage terminal, and a controller provided on a remaining portion of the semiconductor substrate and configured to control a control voltage of a semiconductor switching element based on a second signal and a detection result of the detector.

17 Claims, 7 Drawing Sheets

SWITCHING ELEMENT DRIVE CIRCUIT

BACKGROUND OF THE INVENTION

Field of the Invention

The present disclosure relates to a switching element drive circuit.

Description of the Background Art

Various techniques have been proposed for switching element drive circuits that drive semiconductor switching elements. For example, in Japanese Patent Application Laid-Open No. 2004-274262, a switching drive circuit has been proposed which modulates a voltage of a primary circuit to generate a voltage of a secondary circuit and is provided with a low-voltage circuit as a detection circuit for detecting the state of a semiconductor switching element in the secondary circuit.

However, in the prior art, there has been a problem that the high voltage state of the semiconductor switching element cannot be detected, since the detection circuit detecting the state of the semiconductor switching element is a low voltage circuit of the secondary circuit. Also, when an external circuit is added to enhance the breakdown voltage of the detection circuit in order to solve this problem, other problems such as an increase in the size and cost of the circuit arise.

SUMMARY

The present disclosure has been made in view of the aforementioned problem, and an object thereof is to provide a technique that eliminates the need for an external circuit for enhancing the breakdown voltage.

A switching element drive circuit according to the present disclosure is a switching element drive circuit configured to drive a semiconductor switching element having a control terminal and a high voltage terminal and a low voltage terminal controlled by a control voltage applied to the control terminal, including a primary circuit and a secondary circuit, and an insulating element isolating the primary circuit and the secondary circuit from each other in terms of a direct current, and generate a second signal for the second circuit based on a first signal for the primary circuit, in which the secondary circuit includes a semiconductor substrate, a detector provided on a portion of the semiconductor substrate, including a pn junction isolation portion, and configured to detect a voltage of the high voltage terminal, and a controller provided on a remaining portion of the semiconductor substrate and configured to control the control voltage of the semiconductor switching element based on the second signal and a detection result of the detector.

The need for an external circuit for enhancing the breakdown voltage is eliminated.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
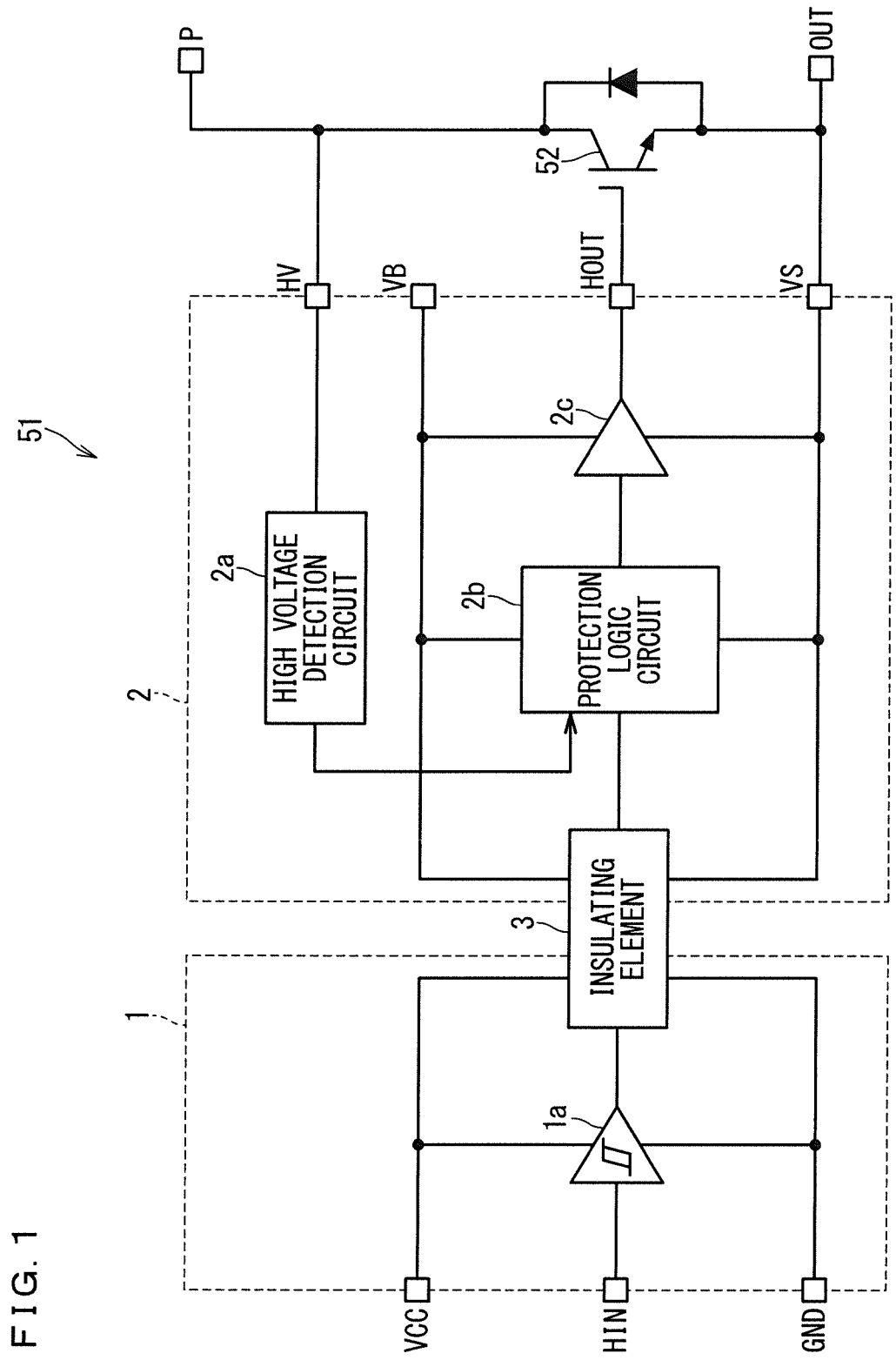
FIG. 1 is a circuit diagram illustrating a configuration of a switching element drive circuit according to Embodiment 1.

Hereinafter, Embodiments will be described with reference to the attached drawings. Features described in each of following Embodiments are examples; therefore, not all features are necessarily essential. Further, in the description to be made below, similar components are denoted by the same or similar reference numerals across a plurality of Embodiments, and descriptions of different components will be mainly made.

Embodiment 1

Figure 2:
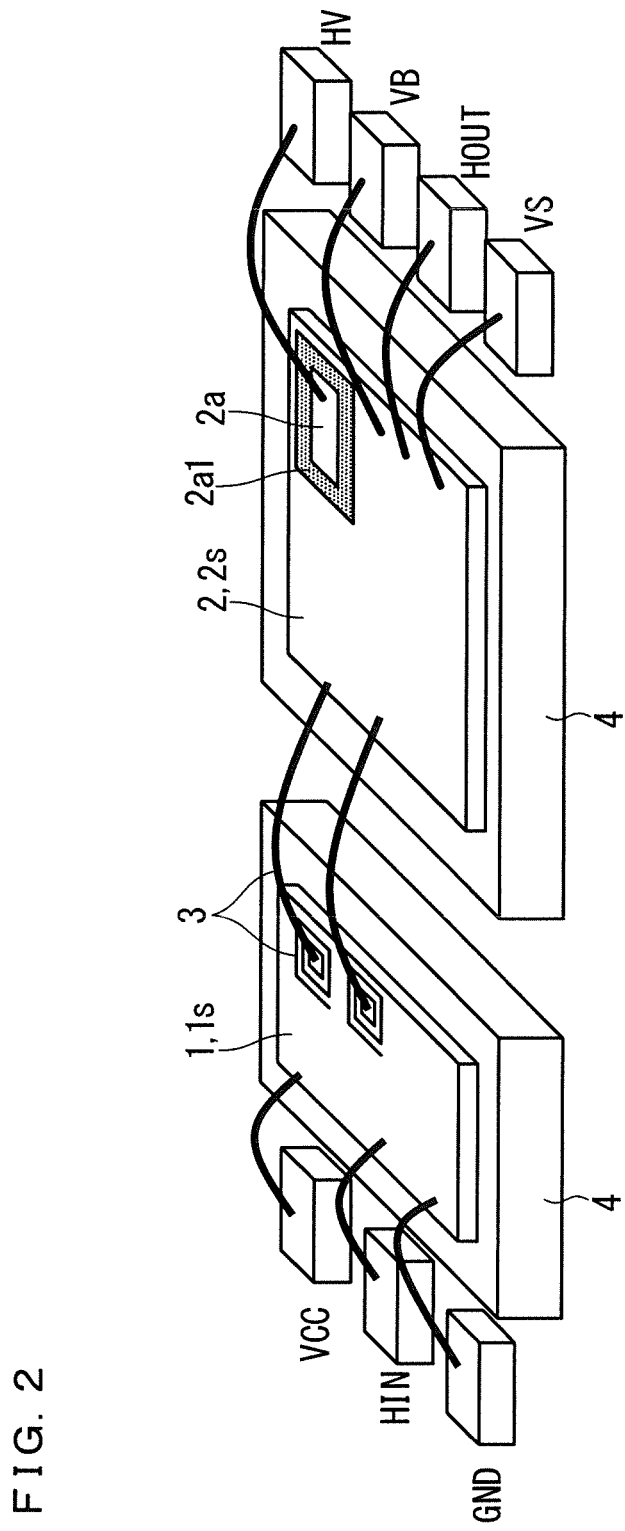
FIG. 2 is a perspective view illustrating a configuration of the switching element drive circuit according to Embodiment 1.

FIG. 1 and FIG. 2 are circuit diagram and a perspective view illustrating a configuration of a switching element drive circuit 51 according to Embodiment 1. The switching element drive circuit 51 is configured to enable to drive a semiconductor switching element 52 through a terminal HOUT.

The semiconductor switching element 52 has a control terminal, and a high voltage terminal and a low voltage terminal controlled by a control voltage applied to the control terminal. In Embodiment 1, the semiconductor switching element 52 is an Insulated Gate Bipolar Transistor (IGBT), the control terminal is a gate terminal connected to the terminal HOUT, the control voltage is a gate voltage, the high voltage terminal is a collector terminal connected to terminals P and HV, and the low voltage terminal is an emitter terminal connected to terminals OUT and VS. Note that the semiconductor switching element 52 is not limited to an IGBT, and may be, for example, a Metal Oxide Semiconductor Field Effect Transistor (MOSFET) or a Reverse Conducting-IGBT (RC-IGBT).

The material of the semiconductor switching element 52 may be ordinary silicon (Si), or may be a wide bandgap semiconductor such as silicon carbide (SiC), gallium nitride (GaN), or diamond. When a wide bandgap semiconductor is adopted to the material of the semiconductor switching element 52, stable operation under high temperature and high voltage and high switching speed are implemented.

The switching element drive circuit 51 drives the semiconductor switching element 52 by controlling the control voltage of the control terminal of the semiconductor switching element 52 through the terminal HOUT. A switching element drive circuit 51 according to Embodiment 1 includes a primary circuit 1, a secondary circuit 2, and an insulating element (isolator) 3.

The primary circuit 1 and the secondary circuit 2 are insulated from each other except for a portion related to the insulating element 3. In Embodiment 1, the primary circuit 1 and the secondary circuit 2 are separately provided on die pads 4 as illustrated in FIG. 2. The primary circuit 1 and the secondary circuit 2 include semiconductor substrates 1s and 2s, respectively, and the semiconductor substrates 1s and 2s are also separately provided on the die pads 4.

The primary circuit 1 includes a signal generation circuit 1a of FIG. 1 in addition to the semiconductor substrate 1s of FIG. 2. The signal generation circuit 1a generates a first signal for the primary circuit 1 based on signals of terminals VCC, HIN and GND.

The insulating element 3 isolates the primary circuit 1 and the secondary circuit 2 from each other in terms of a direct current. Whereas, the insulating element 3 does not isolate the primary circuit 1 and the secondary circuit 2 from each other in terms of an alternating current, and generates a second signal for the secondary circuit 2 based on the first signal generated by the signal generation circuit 1a. The second signal is a signal between terminals VB and VS. As will be described later, the insulating element 3 may be, for example, a transformer or a capacitor.

The secondary circuit 2 includes a high voltage detection circuit 2a, a protection logic circuit 2b, and a drive circuit 2c of FIG. 1 in addition to the semiconductor substrate 2s of FIG. 2. The high voltage detection circuit 2a is included in the concept of the detection section, and the protection logic circuit 2b and the drive circuit 2c are included in the concept of the control section.

As illustrated in FIG. 2, the high voltage detection circuit 2a is provided on a portion of the semiconductor substrate 2s and includes a pn junction isolation portion 2a1. The pn junction isolation portion 2a1 is, for example, a resurf region with a pn junction, where an electric field is relaxed, and is formed by junction isolation process technology. The high voltage detection circuit 2a, that is, a part of the secondary circuit 2 is enhanced in breakdown voltage by the pn junction isolation portion 2a1. Further, as illustrated in FIG. 1, the high voltage detection circuit 2a is connected to the high voltage terminal so that the voltage of the high voltage terminal of the semiconductor switching element 52 can be detected through the terminal HV.

The protection logic circuit 2b and the drive circuit 2c are provided on the remaining portion of the semiconductor substrate 2s. That is, the high voltage detection circuit 2a, the protection logic circuit 2b, and the drive circuit 2c are provided monolithically on the same semiconductor substrate 2s.

The protection logic circuit 2b generates a control signal based on the second signal generated by the insulating element 3 and the detection result of the high voltage detection circuit 2a. The drive circuit 2c controls the control voltage of the semiconductor switching element 52 through the terminal ROUT based on the control signal generated by the protection logic circuit 2b. For example, when the detection result of the high voltage detection circuit 2a indicates that the voltage of the high voltage terminal of the semiconductor switching element 52 is normal, the semiconductor switching element 52 is driven based on the second signal. On the other hand, when the detection result of the high voltage detection circuit 2a indicates that the voltage of the high voltage terminal of the semiconductor switching element 52 is abnormal, the driving of the semiconductor switching element 52 is suspended.

According to the switching element drive circuit 51 according to Embodiment 1 as described above, a high voltage detection circuit 2a is provided on a portion of the semiconductor substrate 2s and includes the pn junction isolation portion 2a1, and the protection logic circuit 2b and the drive circuit 2c are provided on the remaining portion of the semiconductor substrate 2s. Specifically, the high voltage detection circuit 2a, the protection logic circuit 2b, and the drive circuit 2c are monolithically provided, and the high voltage detection circuit 2a, that is, a part of the secondary circuit 2 is enhanced in breakdown voltage by the pn junction isolation portion 2a1, eliminating the need for an external circuit for enhancing the breakdown voltage. As a result, suppression of increase in circuit size and cost can be expected.

Embodiment 2

Figure 3:
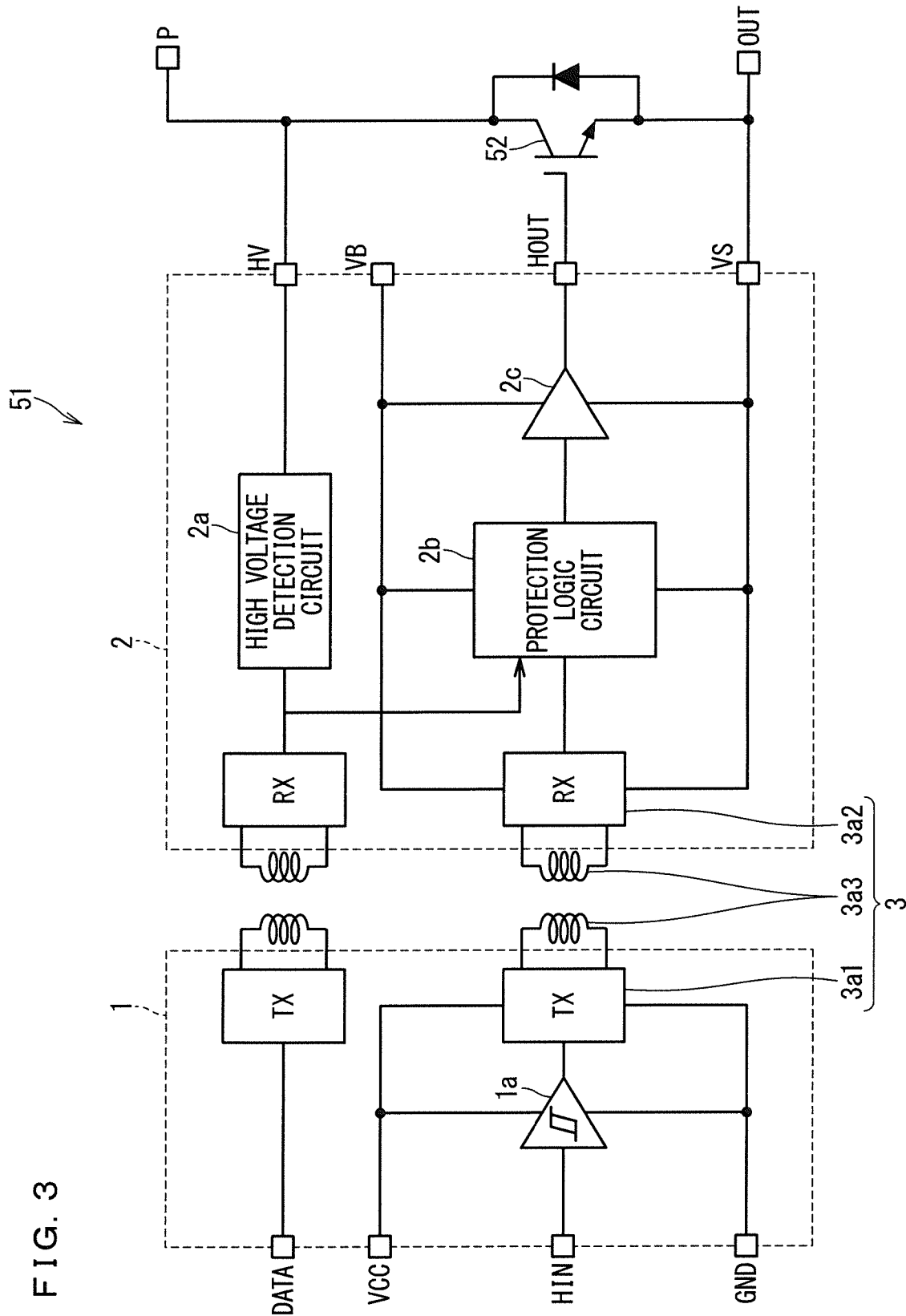
FIG. 3 is a circuit diagram illustrating a configuration of a switching element drive circuit according to Embodiment 2.

FIG. 3 is a circuit diagram illustrating a configuration of a switching element drive circuit 51 according to Embodiment 2. In Embodiment 2, the insulating element 3 includes a modulation circuit (TX circuit) 3a1 provided in the primary circuit 1, a demodulation circuit (RX circuit) 3a2 provided in the secondary circuit 2, and a coreless transformer 3a3 provided therebetween. The coreless transformer 3a3 includes a primary coil connected to the modulation circuit 3a1 and a secondary coil connected to the demodulation circuit 3a2.

The modulation circuit 3a1 modulates the first signal of the primary circuit 1 to flow an alternating current to the primary coil, and the demodulation circuit 3a2 demodulates into the second signal for the secondary circuit based on the alternating current generated in the secondary coil magnetically coupled with the primary coil. Apart from this configuration, the other configurations are identical to the configuration of Embodiment 1.

According to the switching element drive circuit 51 of Embodiment 2 as described above, the insulating element 3 includes the coreless transformer 3a3 which allows the adoption of the magnetic coupling method for the signal transmission from the primary circuit 1 to the secondary circuit 2. As a result, improvement in CMTI (that is, dV/dt tolerance) characteristics of the semiconductor switching element 52 can be expected.

Embodiment 3

Figure 4:
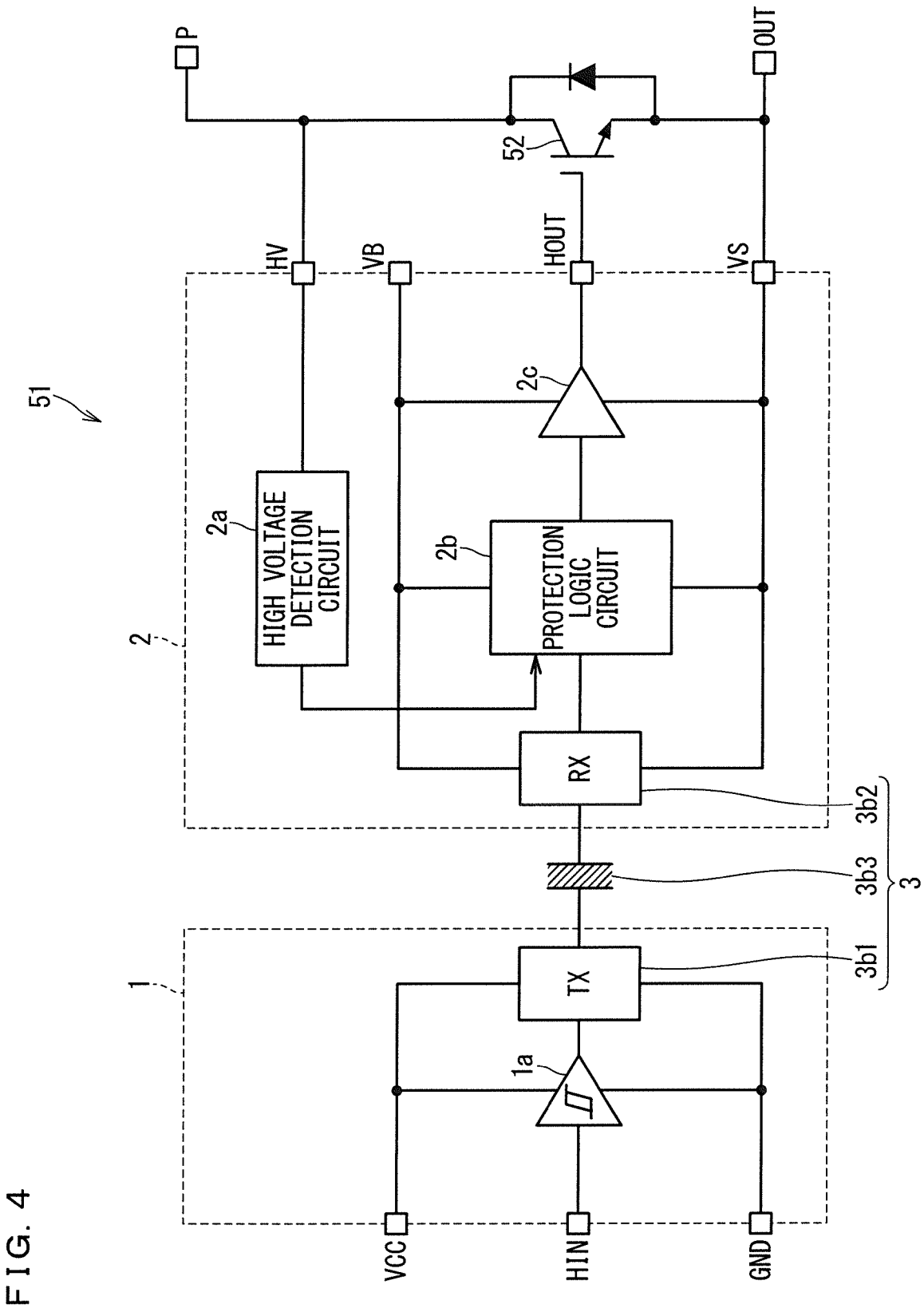
FIG. 4 is a circuit diagram illustrating a configuration of a switching element drive circuit according to Embodiment 3.

FIG. 4 is a circuit diagram illustrating a configuration of a switching element drive circuit 51 according to Embodiment 3. In Embodiment 3, the insulating element 3 includes a modulation circuit (TX circuit) 3b1 provided in the primary circuit 1, a demodulation circuit (RX circuit) 3b2 provided in the secondary circuit 2, and a capacitor 3b3 provided therebetween. The capacitor 3b3 includes a first portion connected to the modulation circuit 3a1 and a second portion connected to the demodulation circuit 3a2. The modulation circuit 3b1 modulates the first signal of the primary circuit 1 to generate an electric field in the first portion, and the demodulation circuit 3b2 demodulates into the second signal for the second circuit based on the electric field generated in the second portion capacitively coupled with the first portion. Apart from this configuration, the other configurations are identical to the configuration of Embodiment 1.

According to the switching element drive circuit 51 of Embodiment 2 as described above, the insulating element 3 includes the capacitor 3b3 which allows the adoption of the capacitive coupling method for the signal transmission from the primary circuit 1 to the secondary circuit 2. As a result, the thickness of the capacitor 3b3, that is, the distance between the first portion and the second portion can be increased at low cost with ease, so that breakdown voltage of the circuit enhanced according to the application can be achieved at low cost with ease.

Embodiment 4

Figure 5:
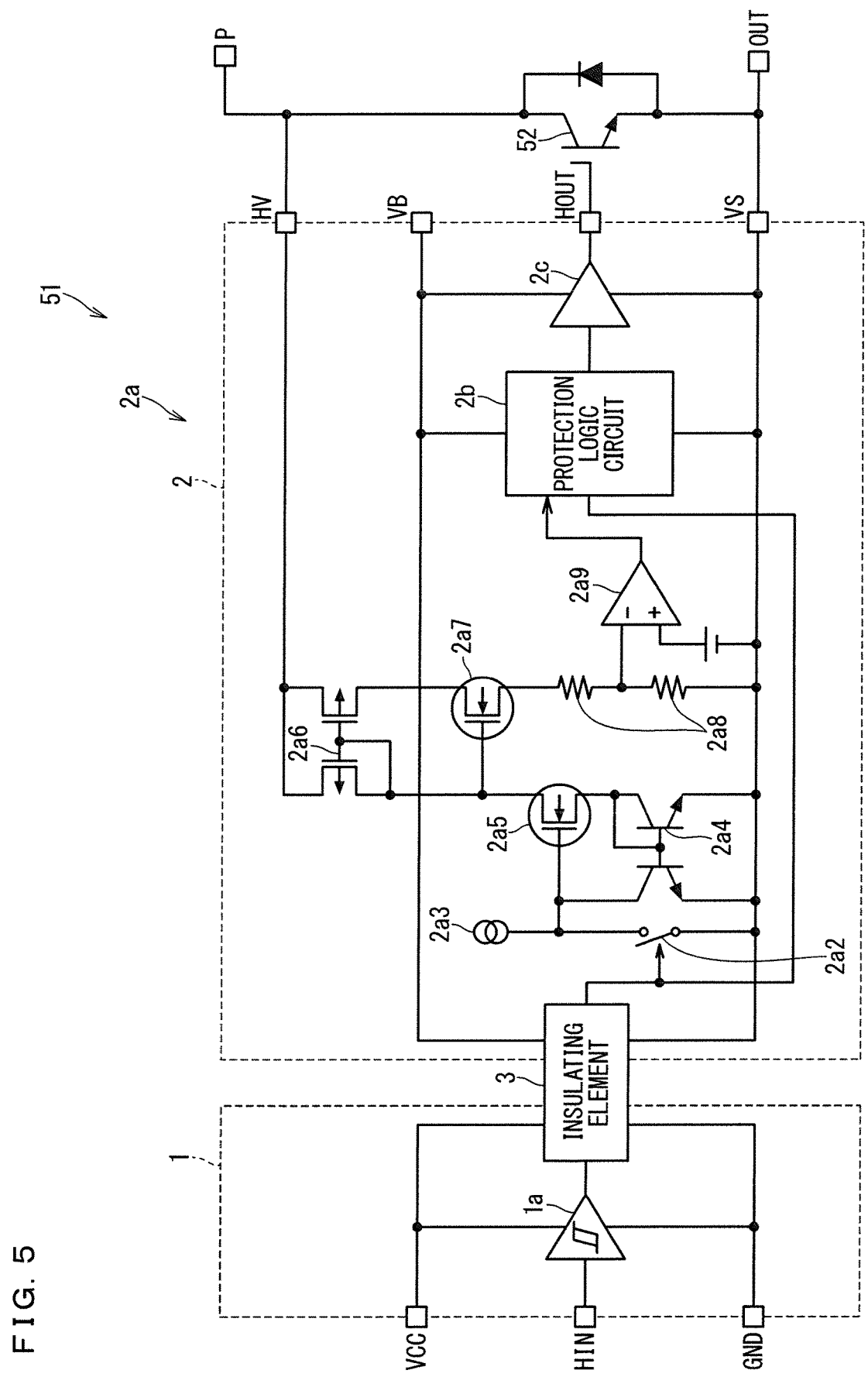
FIG. 5 is a circuit diagram illustrating a configuration of a switching element drive circuit according to Embodiment 4.

FIG. 5 is a circuit diagram illustrating a configuration of a switching element drive circuit 51 according to Embodiment 4. In Embodiment 4, the high voltage detection circuit 2a includes a DESAT circuit (DeSAT circuit). Apart from this configuration, the other configurations are identical to the configuration of Embodiment 1.

In the example of FIG. 5, the DESAT circuit includes a switch 2a2, a constant current circuit 2a3, a circuit 2a4, a high voltage NchMOSFET 2a5, a circuit 2a6, a high voltage PchMOSFET 2a7, a signal conversion circuit 2a8, and a comparator 2a9. The circuit 2a4 is included in a cascode current mirror circuit, and the circuit 2a6 is included in a Wilson current mirror circuit. A pn junction isolation portion 2a1 that enhances the breakdown voltage of the high voltage detection circuit 2a is included in each of the high voltage NchMOSFET 2a5 and the high voltage PchMOSFET 2a7.

By opening the switch 2a2 at the detection timing synchronized with the driving timing of the semiconductor switching element 52, the constant current of the constant current circuit 2a3 flows to the circuit 2a4 and the high voltage NchMOSFET 2a5. Only when the voltage (VCE) between the high voltage terminal and the low voltage terminal of the semiconductor switching element 52 is equal to or higher than a certain voltage, the constant current of the constant current circuit 2a3 is supplied through the circuit 2a6 and the high voltage PchMOSFET 2a7 to the signal conversion circuit 2a8. The signal conversion circuit 2a8 converts the transmitted constant current signal into a voltage signal, and the comparator 2a9 transmits a signal to the protection logic circuit 2b when the voltage signal obtained by the signal conversion circuit 2a8 is equal to or higher than a certain voltage level. The DESAT circuit configured as described above outputs, to the protection logic circuit 2b, the detection result indicating that the voltage of the high voltage terminal is abnormal when the voltage of the high voltage terminal of the semiconductor switching element 52 is equal to or higher than a certain voltage.

According to the switching element drive circuit 51 of Embodiment 4 as described above, the high voltage detection circuit 2a includes the DESAT circuit; therefore, the voltage of the high voltage terminal of the semiconductor switching element 52 can be directly monitored through the terminal HV. Further, according to Embodiment 4, the detection timing can be synchronized with the driving timing; therefore, the blanking time for removing noise during the switching transition period of the semiconductor switching element 52 is not required. This eliminates the need for, for example, a circuit for the short circuit withstand time of the semiconductor switching element 52, simplifying the design. The pn junction isolation portion 2a1 is included in each of the high voltage NchMOSFET 2a5 and the high voltage PchMOSFET 2a7, eliminating the need for an external circuit for enhancing the breakdown voltage, similar to Embodiment 1.

Embodiment 5

Figure 6:
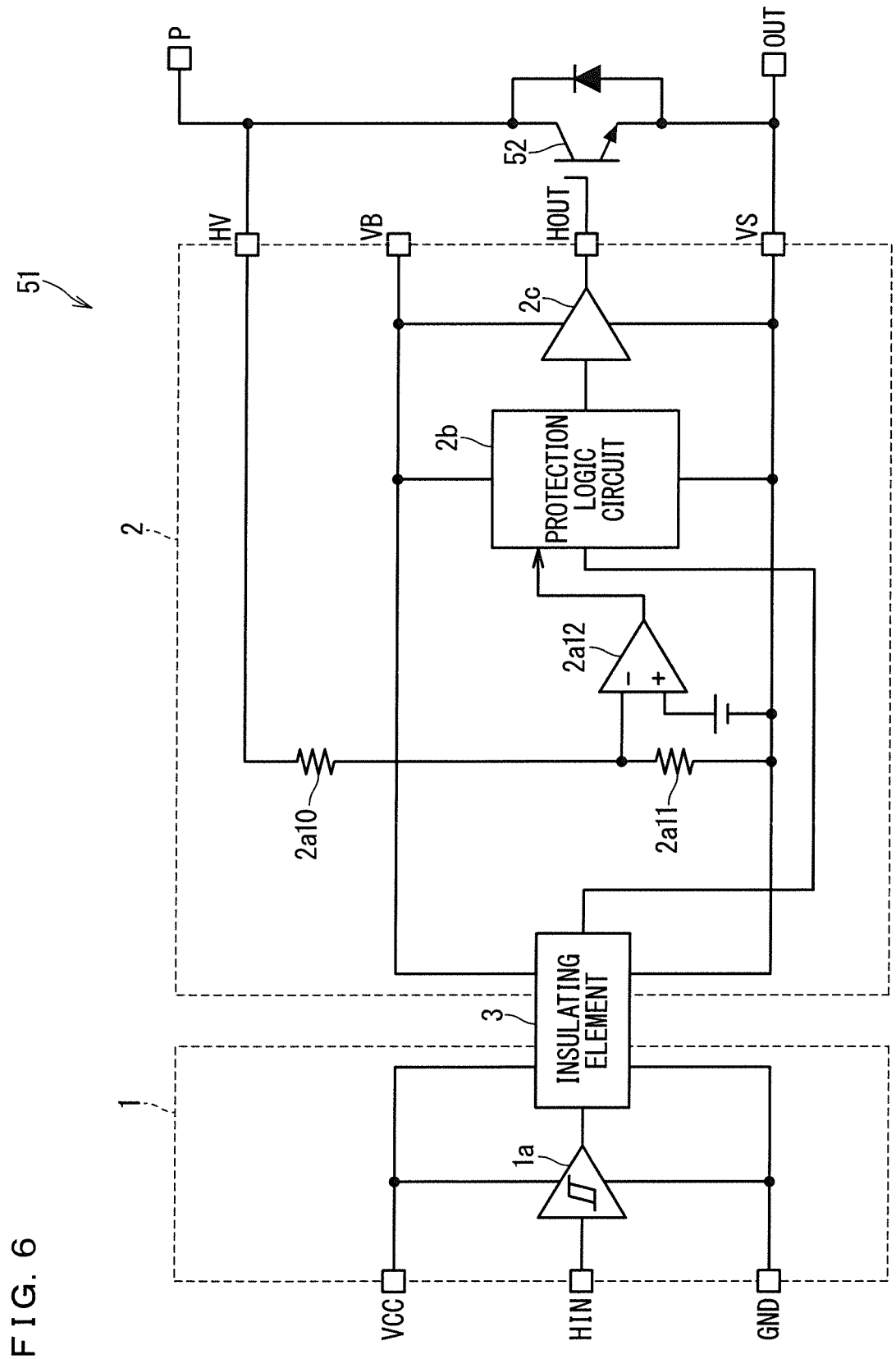
FIG. 6 is a circuit diagram illustrating a configuration of a switching element drive circuit according to Embodiment 5.

FIG. 6 is a circuit diagram illustrating a configuration of a switching element drive circuit 51 according to Embodiment 5. In Embodiment 5, the high voltage detection circuit 2a includes a level detection circuit. Apart from this configuration, the other configurations are identical to the configuration of Embodiment 1.

In the example of FIG. 6, the level detection circuit includes a high breakdown voltage resistor 2a10, a resistor 2a11, and a comparator 2a12. The pn junction isolation portion 2a1 that enhances the breakdown voltage of the high voltage detection circuit 2a is included in the high breakdown voltage resistor 2a10.

The high breakdown voltage resistor 2a10 and the resistor 2a11 divide the voltage of the high voltage terminal of the semiconductor switching element 52 to convert the voltage into a voltage signal lower than the voltage. The comparator 2a9 transmits a signal to the protection logic circuit 2b when the voltage signal obtained by the high breakdown voltage resistor 2a10 and the resistor 2a11 is equal to or higher than a certain voltage level. The level detection circuit configured as described above outputs, to the protection logic circuit 2b, the detection result indicating that the voltage of the high voltage terminal is abnormal when the voltage of the high voltage terminal of the semiconductor switching element 52 is equal to or higher than a certain voltage.

According to the switching element drive circuit 51 of Embodiment 5 as described above, the high voltage detection circuit 2a includes the level detection circuit; therefore, the voltage of the high voltage terminal of the semiconductor switching element 52 can be monitored constantly and directly. The pn junction isolation portion 2a1 is included in the high breakdown voltage 2a10, eliminating the need for an external circuit for enhancing the breakdown voltage, similar to Embodiment 1.

Embodiment 6

Figure 7:
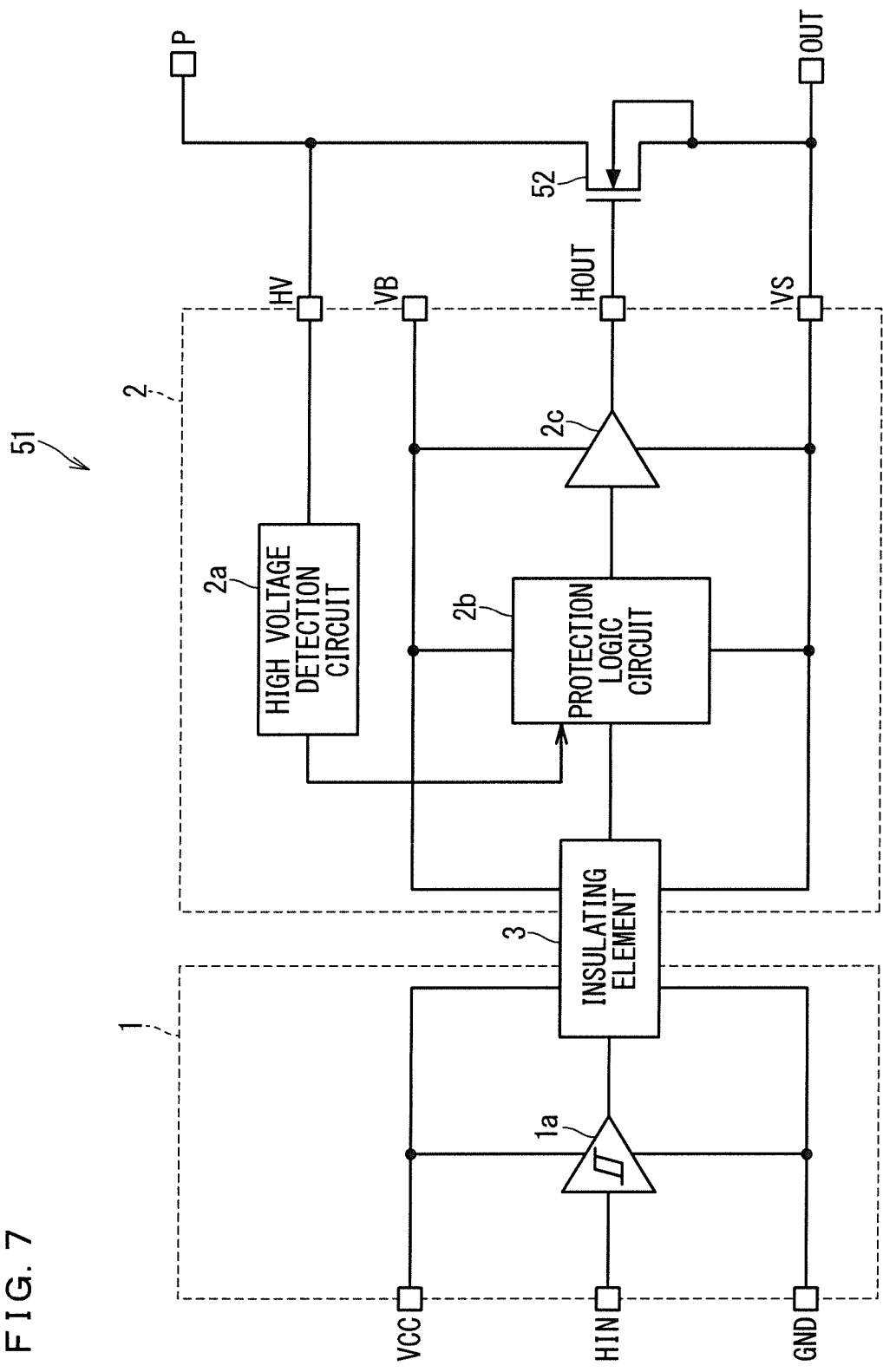
FIG. 7 is a circuit diagram illustrating a configuration of a switching element drive circuit according to Embodiment 6.

FIG. 7 is a circuit diagram illustrating a configuration of a switching element drive circuit 51 according to Embodiment 6. In Embodiment 6, the semiconductor switching element 52 is a SiC-MOSFET. Apart from this configuration, the other configurations are identical to the configuration of Embodiment 1.

SiC-MOSFETs are relatively expensive. In addition, since the short circuit withstand time of a SiC-MOSFET is low, it is considered difficult to set the protection level in the secondary circuit 2 that protects the SiC-MOSFET. Whereas, in the switching element drive circuit 51 described above, for example, the DESAT circuit described in Embodiment 4, which has a short-circuit protection function and is not an external component, can be implemented as the high voltage detection circuit 2a. Therefore, the overall cost can be reduced, and the difficulty in designing the short circuit withstand time can be eased.

Embodiments and Modifications can be combined, and Embodiments and Modifications can be appropriately modified or omitted.

Hereinafter, various aspects of the present disclosure will be collectively described as Appendices.

(Appendix 1)

A switching element drive circuit configured to drive a semiconductor switching element having a control terminal and a high voltage terminal and a low voltage terminal controlled by a control voltage applied to the control terminal, comprising:

a primary circuit and a secondary circuit; and an insulating element isolating the primary circuit and the secondary circuit from each other in terms of a direct current, and generate a second signal for the second circuit based on a first signal for the primary circuit, wherein the secondary circuit includes a semiconductor substrate, a detector provided on a portion of the semiconductor substrate, including a pn junction isolation portion, and configured to detect a voltage of the high voltage terminal, and a controller provided on a remaining portion of the semiconductor substrate and configured to control the control voltage of the semiconductor switching element based on the second signal and a detection result of the detector.

(Appendix 2)

The switching element drive circuit according to Appendix 1, wherein the insulating element includes a transformer.

(Appendix 3)

The switching element drive circuit according to Appendix 1, wherein the insulating element includes a capacitor.

(Appendix 4)

The switching element drive circuit according to any one of Appendices 1 to 3, wherein the detector includes a DESAT circuit.

(Appendix 5)

The switching element drive circuit according to any one of Appendices 1 to 3, wherein the detector includes a level detection circuit.

(Appendix 6)

The switching element drive circuit according to any one of Appendices 1 to 5, wherein the semiconductor switching element is a SiC-MOSFET.

While the invention has been illustrated and described in detail, the foregoing description is in all aspects illustrative and not restrictive. It is therefore understood that numerous modifications and variations can be devised without departing from the scope of the invention.

What is claimed is:

1. A switching element drive circuit configured to drive a semiconductor switching element having a control terminal and a high voltage terminal and a low voltage terminal controlled by a control voltage applied to the control terminal, comprising:

a primary circuit and a secondary circuit; and an insulating element configured to isolate the primary circuit and the secondary circuit from each other in terms of a direct current, and configured to generate a second signal for the secondary circuit based on a first signal for the primary circuit, wherein the secondary circuit includes:

a semiconductor substrate, a detector provided on a portion of the semiconductor substrate, including a pn junction isolation portion, and configured to detect a voltage of the high voltage terminal, and a controller provided on a remaining portion of the semiconductor substrate and configured to control the control voltage of the semiconductor switching element based on the second signal and a detection result of the detector, and the pn junction isolation portion is positioned between internal components of the detector and the controller, and the pn junction isolation portion separates the internal components of the detector from the controller.

2. The switching element drive circuit according to claim 1, wherein the insulating element includes a transformer.

3. The switching element drive circuit according to claim 1, wherein the insulating element includes a capacitor.

4. The switching element drive circuit according to claim 1, wherein the detector includes a DESAT circuit.

5. The switching element drive circuit according to claim 1, wherein the detector includes a level detection circuit.

6. The switching element drive circuit according to claim 1, wherein the semiconductor switching element is a SiC-MOSFET.

7. The switching element drive circuit according to claim 1, wherein the controller includes:

a protection logic circuit configured to generate a control signal based on the second signal generated by the insulating element and the detection result; and a drive circuit configured to receive the control signal and configured to control the control voltage of the semiconductor switching element based on the control signal.

8. The switching element drive circuit according to claim 1, wherein the insulating element includes:

a transformer including a primary coil connected to the primary circuit and a secondary coil connected to the secondary circuit, the primary coil and the secondary coil being magnetically coupled to each other;

a modulation circuit provided in the primary circuit; and a demodulation circuit provided in the secondary circuit, wherein the modulation circuit is configured to modulate the first signal and flow an alternating current to the primary coil, the transformer is configured to flow an other alternating current to the secondary coil by way of magnetic coupling with the primary coil, and the demodulation circuit is configured to demodulate the other alternating current and thereby generate the second signal.

9. The switching element drive circuit according to claim 8, wherein the transformer is coreless.

10. The switching element drive circuit according to claim 1, wherein the insulating element includes:

a capacitor including a first portion connected to the primary circuit and a second portion connected to the secondary circuit, the first portion and the second portion being capacitively coupled with each other;

a modulation circuit provided in the primary circuit; and a demodulation circuit provided in the secondary circuit, wherein the modulation circuit is configured to modulate the first signal and generate an electric field in the first portion, the capacitor is configured to generate an other electric field in the second portion by way of capacitive coupling with the first portion, and the demodulation circuit is configured to demodulate the other electric field and thereby generate the second signal.

11. The switching element drive circuit according to claim 1, wherein
the detector includes a DESAT circuit, the DESAT circuit including:
a switch;
a constant current circuit;
an NchMOSFET;
a PchMOSFET;
a signal conversion circuit comprising a first resistor and a second resistor;
a comparator having an output terminal connected to the controller and an input terminal connected between the first resistor and the second resistor, the comparator being configured to compare a voltage of the input terminal with a threshold voltage;
a first current mirror circuit; and
a second current mirror circuit, wherein
the DESAT circuit is configured to output the detection result to the controller by the comparator, the detection result including a first voltage and a second voltage different from the first voltage,
the DESAT circuit is configured to output the first voltage when a voltage VCE between the high voltage terminal and the low voltage terminal of the semiconductor switching element is equal to or higher than the threshold voltage,
the DESAT circuit is configured to output the second voltage when the voltage VCE is lower than the threshold voltage, and
the controller is configured to suspend the driving of the semiconductor switching element when the DESAT circuit outputs the first voltage.

12. The switching element drive circuit according to claim 11, wherein
the switch is configured to open at a timing synchronized with a driving timing of the semiconductor switching element based on the second signal, and
the constant current circuit is configured to supply constant current through the first current mirror circuit, the NchMOSFET, the second current mirror circuit, and the PchMOSFET to the signal conversion circuit only when the voltage VCE is equal to or higher than the threshold voltage.

13. The switching element drive circuit according to claim 1, wherein
the detector includes a level detection circuit, the level detection circuit comprising:
a first resistor;
a second resistor; and
a comparator having an output terminal connected to the controller and an input terminal connected between the first resistor and the second resistor, the comparator being configured to compare a voltage of the input terminal with a threshold voltage, wherein
the comparator is configured to output the detection result to the controller, the detection result including a first voltage and a second voltage different from the first voltage,
the comparator is configured to output the first voltage when a voltage VCE between the high voltage terminal and the low voltage terminal of the semiconductor switching element is equal to or higher than the threshold voltage, and
the comparator is configured to output the second voltage when the voltage VCE is lower than the threshold voltage,
the controller is configured to suspend the driving of the semiconductor switching element when the comparator outputs the first voltage.

14. The switching element drive circuit according to claim 13, wherein
the first resistor has a higher breakdown voltage than the second resistor.

15. The switching element drive circuit according to claim 14, wherein
the first resistor is connected between the second resistor and the high voltage terminal of the semiconductor switching element.

16. The switching element drive circuit according to claim 1, wherein
the pn junction isolation portion is a resurf region including a pn junction.

17. The switching element drive circuit according to claim 1, wherein
the detector and the controller are provided monolithically on the same semiconductor substrate, and
the pn junction isolation portion is positioned on the semiconductor substrate and the pn junction isolation portion surrounds and separates the internal components of the detector from the controller.

* * * * *